US010571108B2

(12) United States Patent
Zirilli (10) Patent No.: US 10,571,108 B2
(45) Date of Patent: Feb. 25, 2020

(54) VARIABLE AREA MICROJETS TO COOL DIGITAL MICROMIRROR DEVICES

(71) Applicant: Xerox Corporation, Norwalk, CT (US)

(72) Inventor: Francisco Zirilli, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 66 days.

(21) Appl. No.: 15/889,848

(22) Filed: Feb. 6, 2018

(65) Prior Publication Data

US 2019/0242567 A1 Aug. 8, 2019

(51) Int. Cl.
| F21V 29/50 | (2015.01) |
| H01L 21/67 | (2006.01) |
| H01L 23/473 | (2006.01) |
| F21V 29/505 | (2015.01) |
| G02B 26/08 | (2006.01) |
| G02B 7/18 | (2006.01) |
| F21V 29/60 | (2015.01) |

(52) U.S. Cl.
CPC .......... F21V 29/505 (2015.01); F21V 29/60 (2015.01); G02B 7/1815 (2013.01); G02B 26/0833 (2013.01); H01L 21/6715 (2013.01); H01L 23/4735 (2013.01)

(58) Field of Classification Search
CPC ......... H01L 2924/0002; H01L 2924/00; H01L 23/4735; H01L 21/6715; H01L 21/67196; H01L 21/30625; H01L 23/427; F21V 29/505; F21V 29/60; G02B 7/1815; G02B 26/0833
See application file for complete search history.

(56) References Cited

U.S. PATENT DOCUMENTS

| 5,083,194 | A | 1/1992 | Bartilson |
| 7,079,393 | B2 | 7/2006 | Colgan et al. |
| 7,362,574 | B2 | 4/2008 | Campbell et al. |
| 9,252,069 | B2 | 2/2016 | Bhunia et al. |
| 2005/0185244 | A1* | 8/2005 | Fujimori ........... G02F 1/133385 359/237 |
| 2006/0032627 | A1* | 2/2006 | Nakamura ......... G05D 23/1919 165/287 |
| 2006/0117782 | A1* | 6/2006 | Rini .......................... F25B 1/00 62/310 |

(Continued)

OTHER PUBLICATIONS

Jayaraman, S., "Micro Scale Impingement Cooling and its Efficacy on Turbine Vanes, A Numerical Study", Ryerson University MEng Thesis, Toronto, Ontario, 2013, 60 pp.

(Continued)

*Primary Examiner* — Adam B Dravininkas (57) ABSTRACT

An apparatus and a method for cooling a digital micromirror device are disclosed. For example, the apparatus includes a digital micromirror device (DMD), a housing coupled to the DMD, wherein a first side of the housing is coupled to a bottom of the DMD and a cooling block coupled to a second side of the housing that is opposite the first side. The cooling block includes a plate that includes a plurality of openings, a diaphragm coupled to the plate, an air inlet to generate an airflow across the plate, wherein the diaphragm creates a force to move the airflow in a direction that is perpendicular to a direction of the airflow towards the second side of the housing, and an air outlet to collect the airflow.

13 Claims, 6 Drawing Sheets

(56) References Cited

U.S. PATENT DOCUMENTS

| | | | |
|---|---|---|---|
| 2007/0206158 A1* | 9/2007 | Kinoshita | G03B 21/16 353/52 |
| 2008/0002363 A1 | 1/2008 | Campbell et al. | |
| 2009/0219686 A1* | 9/2009 | Ishikawa | F04F 7/00 361/692 |
| 2010/0328619 A1* | 12/2010 | Harland | G03B 21/16 353/54 |
| 2011/0259557 A1* | 10/2011 | Chao | F04B 43/046 165/121 |
| 2014/0204532 A1* | 7/2014 | Mehring | H05K 7/20 361/689 |
| 2017/0084514 A1* | 3/2017 | Kumari | H01L 23/427 |
| 2018/0140343 A1* | 5/2018 | Daly | A61B 18/18 |

OTHER PUBLICATIONS

Arif, Umair and Arif, Mohd, "Feasibility Study of using Nozzles for Air Cooling in Air Cooling System", International Journal of Innovative Research in Science, Engineering and Technology, vol. 6, Issue 7, Jul. 2017, 4 pp.

Phalnikar, K.A., et al., "Behavior of Free and Impinging Supersonic Microjets", AIAA 2001-3047, 31st AIAA Fluid Dynamics Conference & Exhibit, Jun. 11-14, 2001, Anaheim, CA, pp. 1-15.

* cited by examiner

VARIABLE AREA MICROJETS TO COOL DIGITAL MICROMIRROR DEVICES

The present disclosure relates generally to printers and optical components within certain laser imaging modules and, more particularly, to an apparatus and method for cooling a digital micromirror device using variable area microjets.

BACKGROUND

Some printers or imaging devices use a laser imaging module (LIM). The LIM may include one or more lasers that work with one or more optical components to re-direct the laser to a print medium to print an image. During operation, the optical components can absorb a large amount of heat due to the amount of power used by the lasers within the LIM.

Large amounts of heat can negatively affect the optical components. For example, large amounts of heat can cause the optical components to operate improperly, operate with a reduced life expectancy, or in extreme instances, cause the optical components to completely fail. Currently used methods may be inefficient in cooling the optical components to a proper temperature range.

SUMMARY

According to aspects illustrated herein, there are provided an apparatus and a method for cooling a digital micromirror device. One disclosed feature of the embodiments is a laser imaging module that comprises a digital micromirror device (DMD), a housing coupled to the DMD, wherein a first side of the housing is coupled to a bottom of the DMD and a cooling block coupled to a second side of the housing that is opposite the first side. The cooling block includes a plate that includes a plurality of openings, a diaphragm coupled to the plate, an air inlet to generate an airflow across the plate, wherein the diaphragm creates a force to move the airflow in a direction that is perpendicular to a direction of the airflow towards the second side of the housing, and an air outlet to collect the airflow.

Another disclosed feature of the embodiments is a method for cooling the DMD. In one embodiment, the method comprises measuring a temperature of the DMD, determining that the temperature of the DMD is above a threshold, and providing an airflow through a cooling block comprising a plate having a plurality of openings, wherein each one of the plurality of openings has a converging opening in a direction from an inlet side to an outlet side, an air inlet to force an airflow through the plurality of openings towards the DMD, wherein the continuously changing diameter of the plurality of openings increases a velocity of the airflow to an approximately sonic velocity, and an air outlet to collect the airflow.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly discloses an apparatus and method for cooling a digital micromirror device (DMD). As discussed above, some printers or imaging devices use a laser imaging module (LIM). The LIM may include one or more lasers that work with one or more optical components to re-direct the laser to a print medium to print an image. During operation, the optical components can absorb a large amount of heat due to the amount of power used by the lasers within the LIM.

Large amounts of heat can negatively affect the optical components. For example, large amounts of heat can cause the optical components to operate improperly, operate with a reduced life expectancy, or in extreme instances, cause the optical components to completely fail. Currently used methods may be inefficient in cooling the optical components to a proper temperature range.

A DMD presents further challenges to properly cool the DMD due to high heat fluxes involved. Due to how the DMD is mounted on an electrical board, the amount of space available for effective cooling is very limited.

Embodiments of the present disclosure provide a novel apparatus and method that provides a higher heat transfer rate in a cooling block than previous designs. In addition, some embodiments of the cooling block may include variable area microjets to further increase the heat transfer rate and provide more efficient cooling of the DMD.

Figure 1:
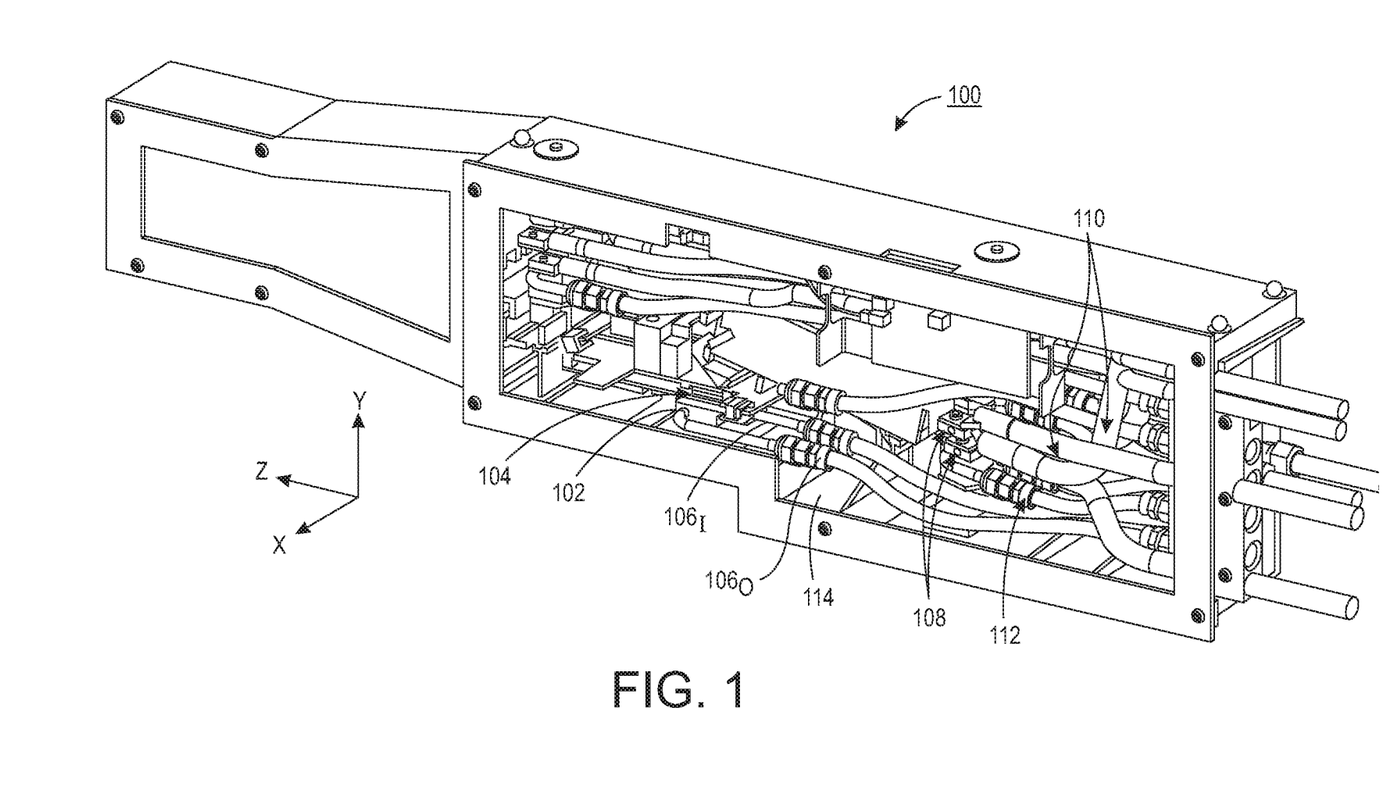
FIG. 1 illustrates an example laser imaging module (LIM) of the present disclosure within a laser imaging module.

FIG. 1 illustrates an example laser imaging module (LIM) or apparatus 100 of the present disclosure. In one embodiment, the LIM 100 may be part of an imaging device or printer. In one embodiment, the LIM 100 may include one or more laser diodes 108 that emit lasers that are redirected by a digital micromirror device (DMD) 104 onto a print medium (e.g., paper, plastic, fabric, and the like). The laser diodes 108 may be connected to a processor, a power source, and the like via one or more electrical connections 110.

In one embodiment, the laser diodes 108 may be powered by a large amount of power. For example, the laser diodes 108 may be powered by as much as 360 Watts of energy and a significant amount of this energy, typically ranging from 40 to 60 Watts, may be absorbed by the DMD. In one embodiment, the laser diodes 108 may be cooled by one or more cooling lines 112.

In one embodiment, the DMD 104 may comprise arrays of small mirrors that are used to redirect the laser, or light, emitted by the laser diodes 108. During operation the large amount of energy of the light emitted by the laser diodes 108 can cause the DMD 104 to rise in temperature. High temperatures can cause damage to the DMD 104 or complete failure. For example, temperatures above 70 degrees Celsius (° C.) can cause the life of the DMD 104 to degrade. Temperatures above 120° C. can cause damage to the DMD 104 or cause the DMD 104 to fail.

As noted above, the DMD 104 may present challenges to properly cool the DMD 104 due to high heat fluxes involved. The amount of space available for effective cooling is very limited due to how the DMD 104 is mounted to the electrical board.

One embodiment of the present disclosure provides a cooling block 102 that is designed to efficiently cool the DMD 104. The cooling block 102 may use a coolant that is moved through the cooling block 102 via an inlet cooling line $106_I$ and an outlet cooling line $106_O$. The inlet cooling line $106_I$ and the outlet cooling line $106_O$ may also be referred to herein collectively as cooling line or lines 106.

In one embodiment, the cooling block 102 and the cooling lines 106 may comprise a metal. For example, the cooling block 102 and the cooling lines 106 may be fabricated from copper or another similar conductive metal.

In one embodiment, the coolant may be a fluid that is used to transfer heat away from the DMD 104. In one example, the fluid may be air. The air may be cooled and flowed through the cooling block 102, as described in further detail below to cool the DMD 104.

In one embodiment, a temperature sensing device 114 may be coupled, directly or indirectly, to cooling block 102 and/or the DMD 104. The temperature sensing device 114 may be a thermistor wire, a thermocouple, or any other type of temperature sensing device.

The temperature sensing device 114 may measure the temperature of the DMD 104. Based on the temperature, a processor or controller, may release, or move, the coolant through the cooling line 106 and the cooling block 102. For example, when the temperature measured by the thermistor wire 114 rises above a temperature threshold (e.g., 70° C., 120° C., and the like), the coolant may be moved through the cooling block 102 to lower, and maintain, the temperature back below the threshold temperature. In another example, the temperature sensing device 114 may be used to send feedback to the processor or controller such that the processor could send a command to a chiller and change an inlet coolant temperature.

Figure 2:
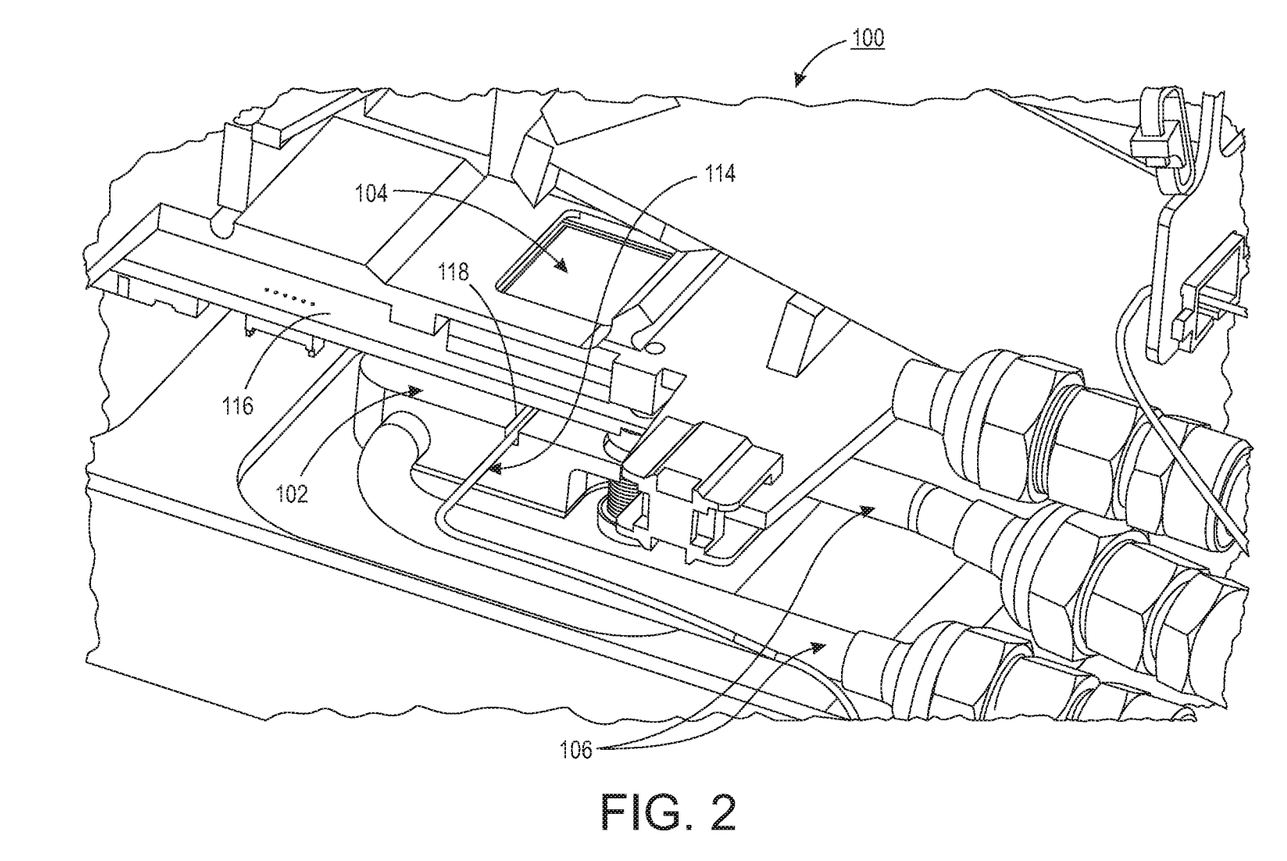
FIG. 2 illustrates a close-up view of an example cooling block within the LIM of the present disclosure.

FIG. 2 illustrates a more detailed view of the cooling block 102 and how it is positioned within the LIM 100. Some components from FIG. 1 have been removed in FIG. 2 to show in greater detail how the DMD 104 is positioned on an electrical board 116 and on the cooling block 102. In one embodiment, the cooling block 102 may include a cut out or groove 118 that holds the temperature sensing device 114.

Although the cooling lines 106 are shown as being run laterally or horizontally into the cooling block 102, it should be noted that the cooling lines 106 may be run vertically into the cooling block 102. For example, the cooling lines 106 may be located below the cooling block 102 and enter from a bottom side of the cooling block 102 rather than the lateral sides of the cooling block 102. Running the cooling lines 106 vertically may help remove some turns that may help reduce the overall pressure drop within the cooling lines 106. Overall, removing as many turns as possible may help reduce the overall pressure within the cooling lines 106 whether the cooling lines 106 are run horizontally or vertically into the cooling block 102. In addition, the cooling lines 106 may be able to deliver, or move, the coolant through the cooling block 102 at a greater velocity, or with more turbulent flow.

Figure 3:
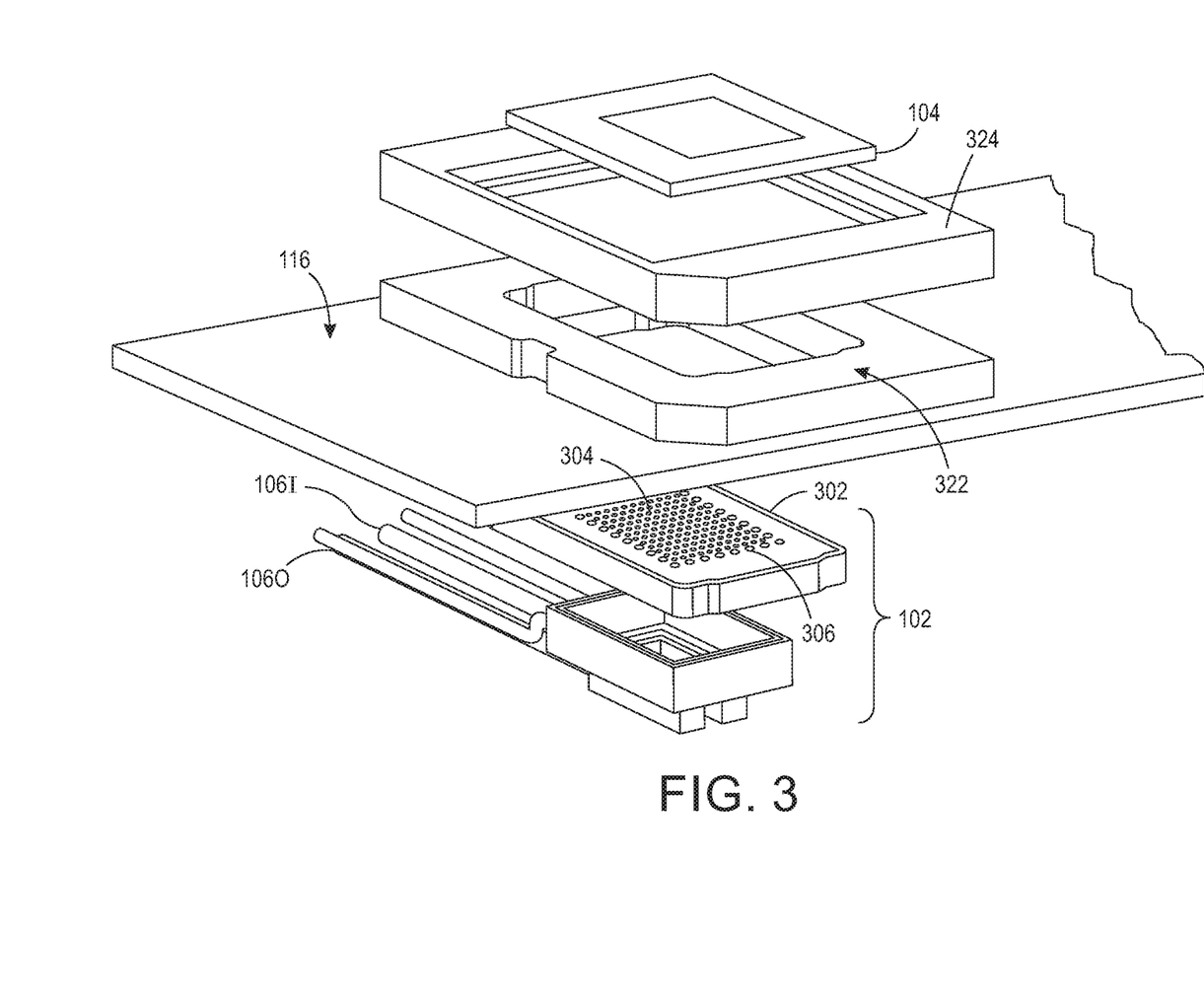
FIG. 3 illustrates an exploded view of an example arrangement of the cooling block of the present disclosure.

FIG. 3 illustrates an exploded view of an example arrangement of the cooling block 102 of the present disclosure. In one embodiment, the DMD 104 may be coupled to a housing 324 that is coupled to a socket 322. The electrical board 116 may have an opening that corresponds to an opening of the socket 322. The opening may allow air to contact the housing 324 that is coupled to the DMD 104.

Figure 4:
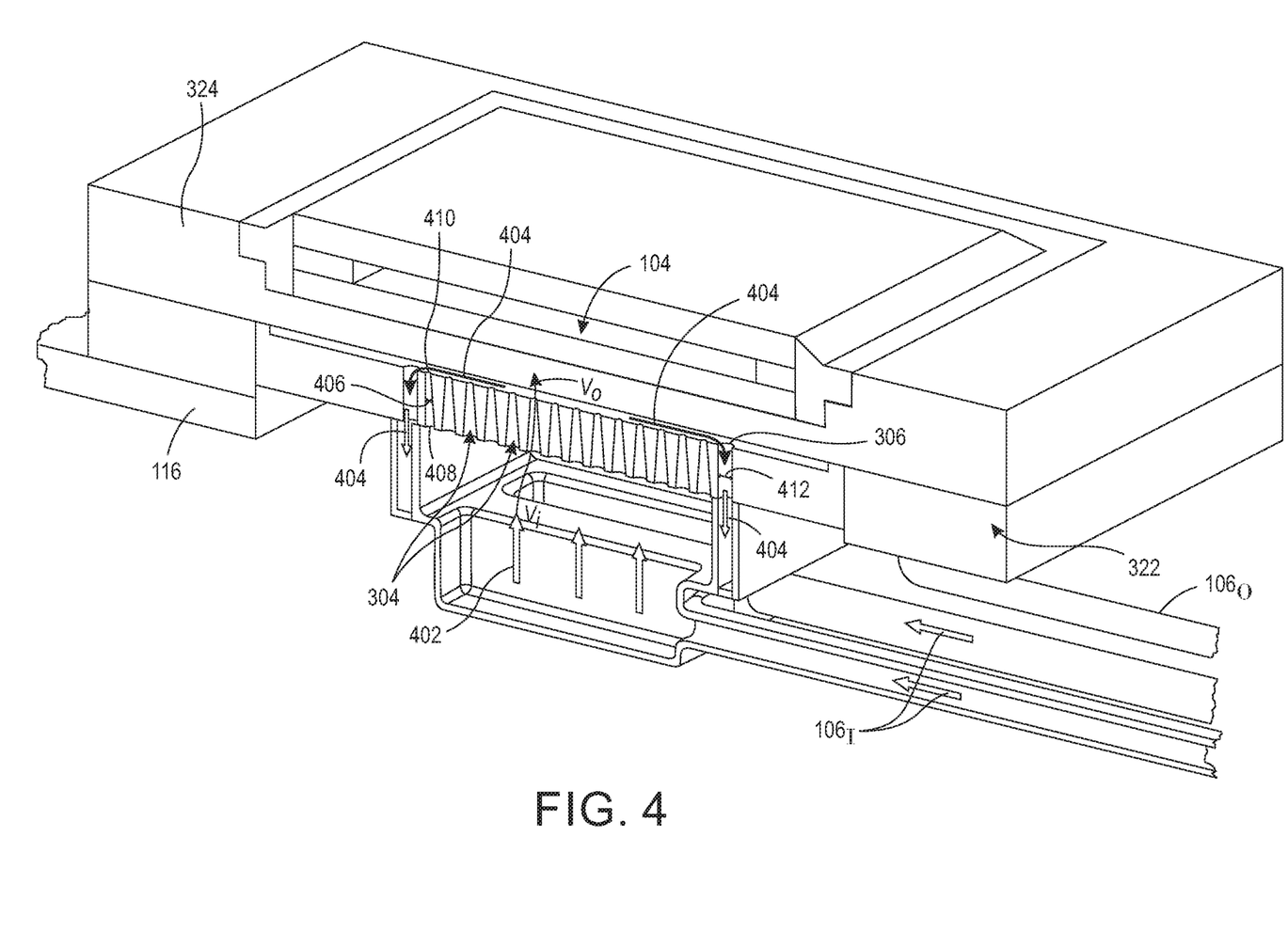
FIG. 4 illustrates a cross sectional view of the example cooling block of the present disclosure.

In one embodiment, the cooling block 102 may include a plate 302 having a plurality of openings 304. In one embodiment, the plate 302 may have a rectangular or square shape. Each one of the plurality of openings 304 may have a converging opening, as illustrated in FIG. 4 and discussed below. In other words, each one of the plurality of openings 304 may have a diameter that continuously changes from an inlet side to an outlet side. Said another way, each one of the plurality of openings 304 may be a conic shape.

In one embodiment, the plurality of openings 304 may be located in an approximately center area of the plate 302. The number of the plurality of openings 304 may be a function of the area of the DMD 104 that is to be cooled. For example, the larger the area, the larger the number of openings 304 that can be deployed, and the smaller the area, the smaller the number of openings 304 that can be deployed. The plurality of openings 304 may be arranged symmetrically. For example, each one of the plurality of openings 304 may be spaced evenly and arranged in a geometric pattern (e.g., a rectangle, square, and the like).

In one embodiment, the plate 302 may also include a plurality of ventilation holes 306. The ventilation holes 306 may be located around a perimeter of the plurality of openings 304. Airflow may be provided from the inlet cooling line $106_I$ up through the plurality of holes 304 in the center of the plate 302 towards the DMD 104. As the airflow cools the DMD 104, the airflow may flow from the center of the plate 302 outward to the sides of the plate 302 towards the ventilation holes 306. The airflow may move down through the ventilation holes 306 and back out through the outlet cooling line $106_O$. When the cooling block 102 is activated, the airflow may be continuous.

FIG. 4 illustrates a cross sectional view of the example cooling block 102 of the present disclosure. FIG. 4 illustrates the converging openings of the plurality of openings 304. In other words, a diameter 406 of each one of the holes 304 may continuously shrink or converge moving from an inlet side 408 to an outlet side 410. As noted above, the converging openings of the plurality of openings 304 may have a conic shape. Notably, the plurality of openings 304 have a smooth and flat surface as the diameter 406 is continuously shrinking. In other words, the plurality of openings 304 do not have sudden changes in diameters, a saw tooth pattern, and the like as the diameter 406 is continuously changing.

In one embodiment, the diameter 406 of the inlet side 408 may be approximately 50-100 microns. The diameter 406 of the inlet side 408 may be approximately 1.5 to 2.0 times larger than the diameter 406 of the outlet side 410. To illustrate, if the diameter 406 of the inlet side 408 were 50 microns, the diameter 406 of the outlet side 410 would be approximately 25 microns to 33.3 microns.

The change in the diameter 406 from the inlet side 408 to the outlet side 410 may allow the airflow to accelerate to an approximately sonic velocity. In other words, the plurality of openings 304 may form variable area microjets that increase the velocity of the airflow. The increase in velocity may cause the airflow to have a much lower temperature. For example, the inlet velocity ($v_i$) may be increased to an outlet velocity ($v_o$) that has a Mach number of approximately 1 or 343 meter per second (m/s). The change in velocity may cause the airflow to change from an inlet temperature of approximately 23 degrees Celsius (° C.) to an outlet temperature of as low as −18.3° C.

In one embodiment, the air temperature may be predicted based on Equations (1)-(3) below. The Equations (1)-(3) below may be used to predict the air temperature assuming the airflow is isentropic.

$$\frac{T}{T_0} = \left\{1 + \frac{\gamma-1}{2}M^2\right\}^{-1}, \qquad \text{Equation (1)}$$

$$\frac{P}{P_0} = \left\{1 + \frac{\gamma-1}{2}M^2\right\}^{-\frac{\gamma-1}{\gamma}}, \qquad \text{Equation (2)}$$

$$\frac{\rho}{\rho_0} = \left\{1 + \frac{\gamma-1}{2}M^2\right\}^{-\frac{1}{\gamma-1}}, \qquad \text{Equation (3)}$$

wherein T is the outlet temperature, $T_o$ is the initial, or inlet temperature, P is the outlet pressure, $P_o$ is the initial, or inlet pressure, $\rho$ is the density of air exiting the plurality of holes 104, $\rho_0$ is the reference density (e.g., the density of the air in a reservoir that is provided to the cooling block 102), M is the Mach number, and $\gamma$ is a specific heat ratio (e.g., 1.4 for air).

Based on the desired outlet temperature, pressure drop and Mach number obtained from Equations (1)-(3) above, the exit area (which can be used to calculate the desired diameter 406) can be calculated using Equation (4) below:

$$\frac{A}{A_*} = \frac{1}{M}\left(\frac{2}{\gamma+1}\left(1 + \frac{\gamma-1}{2}M^2\right)\right)^{\frac{1}{2}\frac{\gamma+1}{\gamma-1}}, \qquad \text{Equation (4)}$$

wherein A is the area (or diameter based off of the relationships area=$\pi$*radius$^2$ and diameter=2*radius) of the outlet side 410 of the openings 304 and A* is the critical area needed to achieve a Mach number of 1 at the outlet side 410 of the openings 304.

In one embodiment, the diameter 406 of the inlet side 408 may be approximately 50-100 microns. The diameter 406 of the inlet side 408 may be approximately 1.5 to 2.0 times larger than the diameter 406 of the outlet side 410.

The air may flow from the inlet cooling line $106_I$ up through the plurality of openings 304 as shown by arrows 402. The airflow may be fed at an inlet velocity, $v_i$, and have an outlet velocity, $v_o$, that reach approximately sonic speeds after traveling through the plurality of openings 304.

When the airflow exits the plurality of openings 304 on the outlet side 410, the air may be at temperatures as low as −18.3° C., as noted above. The airflow may move from the center across the back of the second side of the housing 324 to cool the DMD 104, as shown by arrows 404. The airflow may move down the ventilation holes 306 and out of the cooling block 102 to the outlet cooling line $106_O$.

In one embodiment, a diameter 412 of the ventilation holes 306 may be larger than the diameter 406 of the outlet side 410 of the plurality of openings 304. In one embodiment, the diameter 412 of the ventilation holes 306 may be approximately 5 times the diameter 406 of the outlet side 410 of the plurality of openings 306.

As a result, the cooling block 102 of the present disclosure may provide an efficient cooling system to cool the DMD 104. For example, the variable area microjets formed by the size, shape, and dimensions of the plurality of openings 304, as described above, can accelerate an airflow to velocities near sonic speeds. The increase in speeds can drastically lower the temperature of the airflow that help efficiently cool the DMD 104. The airflow is heated by the heat transfer from the DMD 104, and recycled in a continuous system through the cooling block 102 described above.

Figure 5:
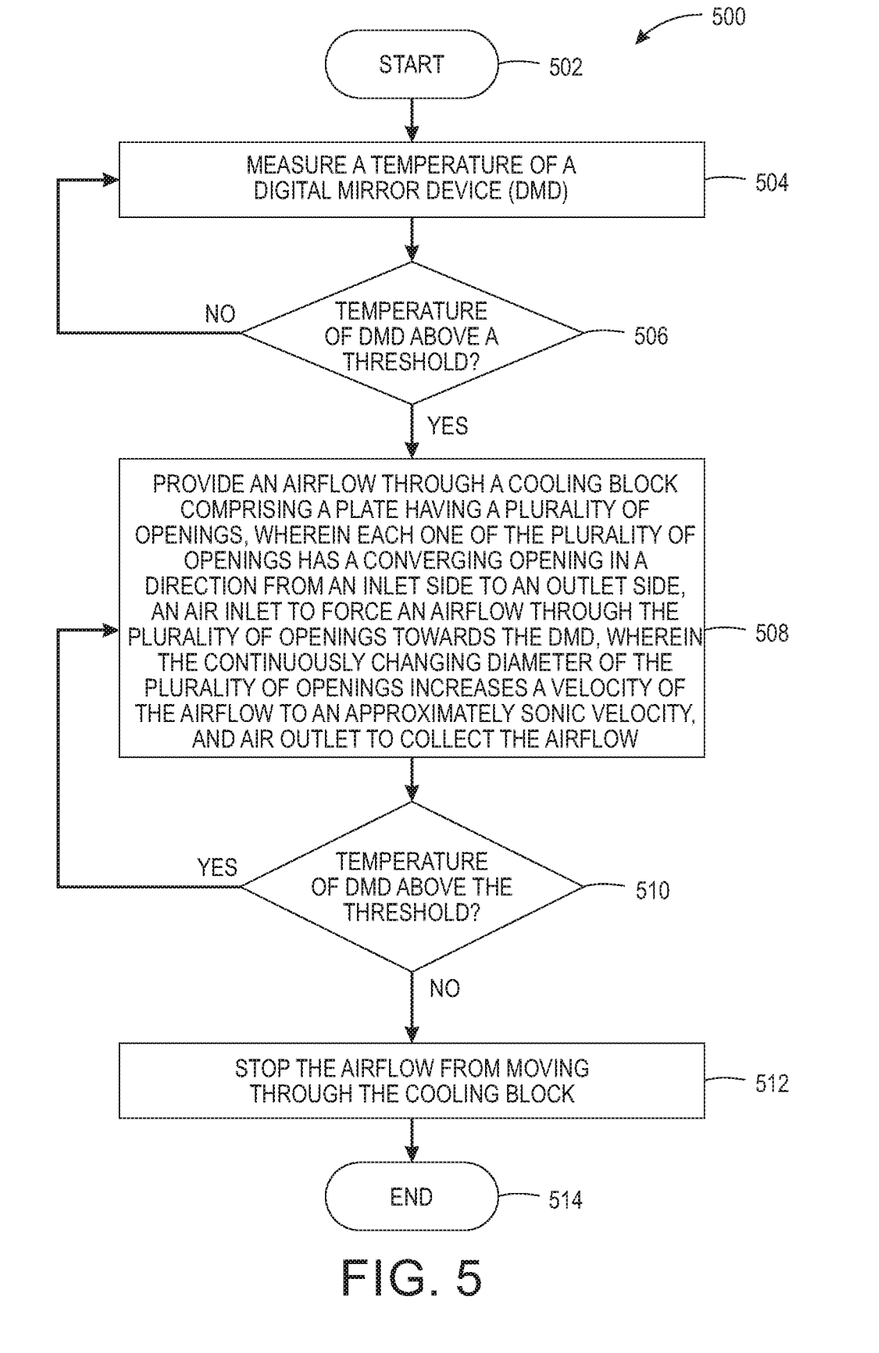
FIG. 5 illustrates a flowchart of an example method for cooling a digital mirror device.
Figure 6:
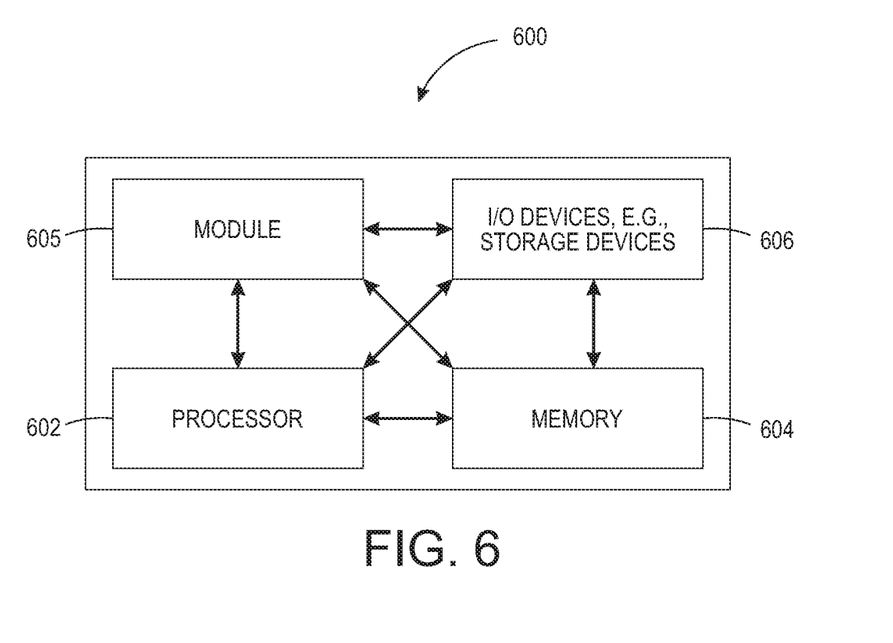
FIG. 6 illustrates a high-level block diagram of a computer suitable for use in performing the functions described herein.

FIG. 5 illustrates a flowchart of an example method 500 for cooling a digital mirror device. In one embodiment, one or more steps or operations of the method 500 may be performed by the LIM 100 or a computer that controls the LIM 100 as illustrated in FIG. 6 and discussed below.

At block 502, the method 500 begins. At block 504, the method 500 measures a temperature of the DMD. For example, the temperature sensing device may measure the temperature of the DMD.

At block 506, the method 500 determines if the temperature of the DMD is above a threshold. For example, the threshold may be a temperature that is associated with degradation of life or failure of the DMD. In one embodiment, the threshold may be 20° C.-30° C. However, the threshold temperature may be dependent on a location of the temperature sensing device and can vary based on the location and other environmental factors.

If the temperature is not above the threshold temperature, the method 500 may return to block 504 and continue monitoring the temperature of the DMD. However, if the temperature is above the threshold temperature, the method 500 may proceed to block 508.

At block 508, the method 500 may provide an airflow through a cooling block comprising a plate having a plurality of openings, wherein each one of the plurality of openings has a converging opening in a direction from an inlet side to an outlet side, an air inlet to force an airflow through the plurality of openings towards the DMD, wherein the continuously changing diameter of the plurality of openings increases a velocity of the airflow to an approximately sonic velocity, and an air outlet to collect the airflow. For example, as discussed above, the airflow be provided at an initial velocity and forced through the openings. The converging openings may accelerate the airflow to an outlet velocity that is an approximately sonic velocity. For example, the outlet velocity may reach speeds up to a Mach number of 1 or approximately 343 m/s.

The change in velocity and pressure created by the converging openings may drop the temperature of the airflow to temperatures as low as −18.3° C. from an initial temperature of approximately 23° C., or room temperature. The low temperature of the airflow may efficiently remove heat absorbed by the DMD as it contacts the backside of the housing coupled to the DMD.

At optional block 510, the method 500 determines if the temperature of the DMD is above the threshold. For example, the temperature sensing device may continue to measure the temperature of the DMD. If the temperature of the DMD remains above the threshold, the method 500 may loop back to block 508 and continue to cool the DMD via the air that is delivered through the cooling block.

However, if the temperature of the DMD is below the threshold, the method 500 may continue to optional block 512. At optional block 512, the method 500 may stop the airflow from moving through the cooling block. At block 514, the method 500 ends.

In one embodiment, the method 500 may loop indefinitely from block 512 back to block 504. In other words, the method 500 may continuously measure the temperature of the DMD and cool the DMD via the airflow moved through the cooling block as long as the LIM is operating.

It should be noted that although not explicitly specified, one or more steps, functions, or operations of the method 500 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks or operations in FIG. 5 that recite a determining operation or involve a decision do not necessarily require that both branches of the determining operation be practiced. In other words, one of the branches of the determining operation can be deemed as an optional step. In addition, one or more steps, blocks, functions or operations of the above described method 500 may comprise optional steps, or can be combined, separated, and/or performed in a different order from that described above, without departing from the example embodiments of the present disclosure. Furthermore, the use of the term "optional" in the above disclosure does not mean that any other steps not labeled as "optional" are not optional. As such, any claims not reciting a step that is not labeled as optional is not to be deemed as missing an essential step, but instead should be deemed as reciting an embodiment where such omitted steps are deemed to be optional in that embodiment.

FIG. 6 depicts a high-level block diagram of a computer that is dedicated to perform the functions described herein. As depicted in FIG. 6, the computer 600 comprises one or more hardware processor elements 602 (e.g., a central processing unit (CPU), a microprocessor, or a multi-core processor), a memory 604, e.g., random access memory (RAM) and/or read only memory (ROM), a module 605 for cooling a digital mirror device, and various input/output devices 606 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the computer may employ a plurality of processor elements. Furthermore, although only one computer is shown in the figure, if the method(s) as discussed above is implemented in a distributed or parallel manner for a particular illustrative example, i.e., the steps of the above method(s) or the entire method(s) are implemented across multiple or parallel computers, then the computer of this figure is intended to represent each of those multiple computers. Furthermore, one or more hardware processors can be utilized in supporting a virtualized or shared computing environment. The virtualized computing environment may support one or more virtual machines representing computers, servers, or other computing devices. In such virtualized virtual machines, hardware components such as hardware processors and computer-readable storage devices may be virtualized or logically represented.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a computer or any other hardware equivalents, e.g., computer readable instructions pertaining to the method(s) discussed above can be used to configure a hardware processor to perform the steps, functions and/or operations of the above disclosed methods. In one embodiment, instructions and data for the present module or process 605 for cooling a digital mirror device (e.g., a software program comprising computer-executable instructions) can be loaded into memory 604 and executed by hardware processor element 602 to implement the steps, functions or operations as discussed above in connection with the example method 500. Furthermore, when a hardware processor executes instructions to perform "operations," this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 605 for cooling a digital mirror device (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:
1. A laser imaging module (LIM), comprising:
a digital micromirror device (DMD);
a housing coupled to the DMD, wherein a first side of the housing is coupled to a bottom of the DMD; and
a cooling block coupled to a second side of the housing that is opposite the first side, wherein the cooling block comprises:
a plate comprising a plurality of openings, wherein each one of the plurality of openings has a converging opening in a direction from an inlet side to an outlet side;
an air inlet to force an airflow through the plurality of openings towards the second side of the housing, wherein the continuously changing diameter of the plurality of openings increases the airflow to an approximately sonic velocity; and
an air outlet to collect the airflow.

2. The LIM of claim 1, wherein the plurality of openings are arranged symmetrically in a center area of the plate.

3. The LIM of claim 1, wherein the plate comprises a plurality of ventilation holes located around the plurality of openings, wherein the airflow moves out of the cooling block through the plurality of ventilation holes towards the air outlet.

4. The LIM of claim 3, wherein a diameter of the plurality of ventilation holes comprises approximately 5 times a diameter of the outlet side of the plurality of openings.

5. The LIM of claim 1, wherein the converging opening comprises a continuously changing diameter in the direction from the inlet side to the outlet side.

6. The LIM of claim 5, wherein the plurality of openings have a conic shape.

7. The LIM of claim 5, wherein a diameter of the inlet side of the plurality of openings is approximately 1.5 to 2.0 times larger than a diameter of the outlet side of the plurality of openings.

8. The LIM of claim 1, wherein a diameter of an inlet side of the plurality of openings is approximately 50-100 microns.

9. The LIM of claim 1, wherein the airflow is continuous.

10. The LIM of claim 1, wherein the approximately sonic velocity comprises approximately a Mach number of approximately 1 or approximately 343 meters per second.

11. The LIM of claim 1, further comprising:
a temperature sensing device measure a temperature of the DMD.

12. A laser imaging module (LIM), comprising:
a digital micromirror device (DMD);
a housing coupled to the DMD, wherein a first side of the housing is coupled to a bottom of the DMD;
a rectangular plate coupled to a second side of the housing that is opposite the first side, the rectangular plate comprising:
a plurality of openings located in a rectangular area towards a center of the rectangular plate, wherein each one of the plurality of openings has a conic shape that has a continuously shrinking diameter in a direction from an inlet side to an outlet side; and
a plurality of ventilation holes located around the plurality of openings;
an air inlet coupled to the plurality of openings to force an airflow moving at an initial velocity through the plurality of openings towards the second side of the housing, wherein the continuously changing diameter of the plurality of openings increases the airflow to a velocity of approximately a Mach number of 1; and
an air outlet coupled to a second end that is opposite the first end of the rectangular plate to collect the airflow that exits via the plurality of ventilation holes.

13. The LIM of claim 12, wherein a diameter of an inlet side of the plurality of openings is approximately 50-100 microns and wherein the diameter of the inlet side of the plurality of openings is approximately 1.5 to 2.0 times larger than a diameter of the outlet side of the plurality of openings.

* * * * *